(12) United States Patent
Uemura et al.

(10) Patent No.: US 11,340,318 B2
(45) Date of Patent: May 24, 2022

(54) MAGNETIC SENSOR AND MAGNETIC DETECTION METHOD

(71) Applicant: ABLIC Inc., Tokyo (JP)

(72) Inventors: Hirotaka Uemura, Tokyo (JP); Atsushi Igarashi, Tokyo (JP); Takahiro Kato, Tokyo (JP)

(73) Assignee: ABLIC Inc., Tokyo (JP)

( * ) Notice: Subject to any disclaimer, the term of this patent is extended or adjusted under 35 U.S.C. 154(b) by 0 days.

(21) Appl. No.: 17/183,375

(22) Filed: Feb. 24, 2021

(65) Prior Publication Data

US 2021/0270915 A1    Sep. 2, 2021

(30) Foreign Application Priority Data

Feb. 27, 2020  (JP) .............................. JP2020-032144

(51) Int. Cl.
*G01R 33/09* (2006.01)
*H01L 43/04* (2006.01)
*H01L 43/06* (2006.01)
*G01R 33/07* (2006.01)

(52) U.S. Cl.
CPC ........... *G01R 33/091* (2013.01); *G01R 33/07* (2013.01); *H01L 43/04* (2013.01); *H01L 43/065* (2013.01)

(58) Field of Classification Search
CPC ........ G01R 33/091; G01R 33/07; H01L 43/04
See application file for complete search history.

(56) References Cited

U.S. PATENT DOCUMENTS

| | | | |
|---|---|---|---|
| 9,228,860 B2 | 1/2016 | Sharma et al. | |
| 2007/0279053 A1* | 12/2007 | Taylor | G01R 15/207 324/252 |
| 2008/0013298 A1 | 1/2008 | Sharma et al. | |
| 2009/0058412 A1* | 3/2009 | Taylor | G01R 15/207 324/252 |
| 2015/0285874 A1 | 10/2015 | Taylor et al. | |
| 2017/0370969 A1* | 12/2017 | Okuyama | G01R 15/207 |

FOREIGN PATENT DOCUMENTS

JP       2009544149       12/2009

* cited by examiner

*Primary Examiner* — Alvaro E Fortich
(74) *Attorney, Agent, or Firm* — JCIPRNET

(57) ABSTRACT

A magnetic sensor has a Hall IC that has a Hall element formed on a surface of the Hall IC, and a lead frame that supports the Hall IC. The lead frame includes a first region that is disposed in the vicinity of the Hall element and generates a first magnetic field due to a first eddy current generated when a measurement target magnetic field is applied, and second regions that are disposed away from the first region and generate a second magnetic field having an intensity that cancels the first magnetic field by means of second eddy currents generated when the measurement target magnetic field is applied.

20 Claims, 20 Drawing Sheets

MAGNETIC SENSOR AND MAGNETIC DETECTION METHOD

CROSS-REFERENCE TO RELATED APPLICATIONS

This application claims the priority benefit of Japanese Patent Application No. 2020-032144, filed on Feb. 27, 2020. The entirety of the above-mentioned patent application is hereby incorporated by reference herein and made a part of this specification.

BACKGROUND

Technical Field

The present invention relates to a magnetic sensor and a magnetic detection method.

Description of Related Art

Many magnetic sensors have been hitherto developed in which a semiconductor device (semiconductor chip) having a magnetic detection element is supported by a conductive lead frame and is covered with a resin for sealing. The magnetic detection element shows directivity such as a Hall element and is formed on the surface of the semiconductor device.

In magnetic sensors having such a structure, variation of an intensity or an applying direction of the measurement target magnetic field causes a problem that transient response characteristics with respect to the measurement target magnetic field deteriorate since an eddy current appears in a lead frame to generate a magnetic field in a direction which cancels the measurement target magnetic field and having a magnitude corresponding to the intensity or a variation velocity of the measurement target magnetic field.

In contrast, for example, a magnetic sensor having a structure in which a notch is provided in a lead frame such that the lead frame is not present in the vicinity of a magnetic detection element has been disclosed (for example, refer to Published Japanese Translation No. 2009-544149 of the PCT International Publication and the like).

SUMMARY

In an aspect of the invention a magnetic sensor capable of improving transient response characteristics with respect to a measurement target magnetic field is provided.

According to an embodiment, there is provided a magnetic sensor including a semiconductor device, a magnetic detection element formed on a surface of the semiconductor, and a conductive substrate that supports the semiconductor device. The conductive substrate includes a first region that is disposed in the vicinity of the magnetic detection element and generates a first magnetic field from a first eddy current generated by an application of a measurement target magnetic field is applied, and a second region that is disposed away from the first region and generates a second magnetic field having an intensity that cancels the first magnetic field from a second eddy current generated by an application of the measurement target magnetic field.

According to an aspect of the invention, it is possible to provide a magnetic sensor capable of improving transient response characteristics with respect to a measurement target magnetic field.

DESCRIPTION OF THE EMBODIMENTS

Figure 1:
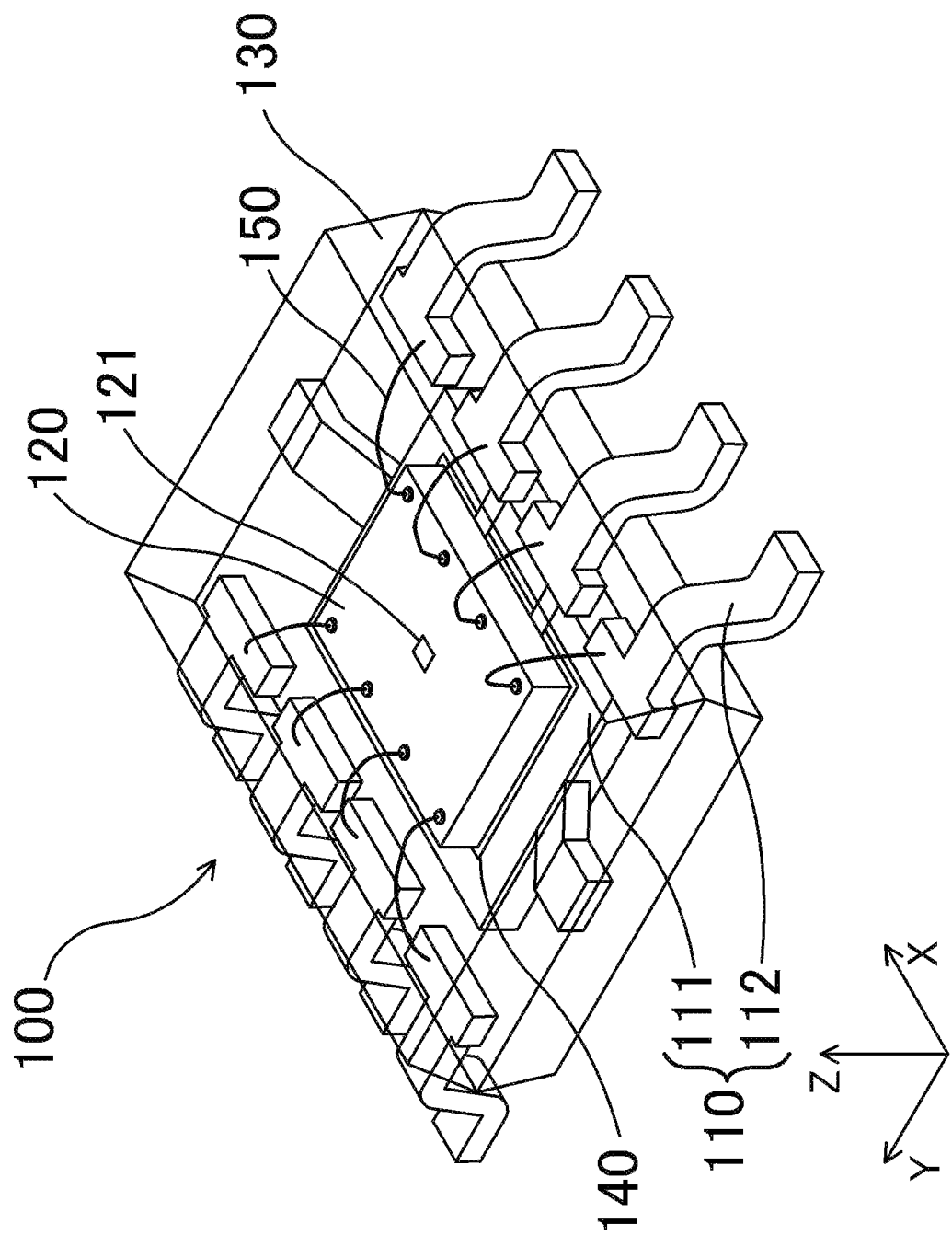
FIG. 1 is a transparent perspective view illustrating a magnetic sensor according to a first embodiment.

A magnetic sensor according to an embodiment of the invention has a semiconductor device, a magnetic detection element formed on a surface of the semiconductor device, and a conductive substrate that supports the semiconductor device. The conductive substrate includes a first region that is disposed in the vicinity of the magnetic detection element and generates a first magnetic field from a first eddy current generated by an application of a measurement target magnetic field, and a second region that is disposed away from the first region and generates a second magnetic field having an intensity that cancels the first magnetic field from a second eddy current generated by an application of the measurement target magnetic field.

Disposing the second region away from the first region in the conductive substrate denotes that the regions are formed to be independent to an extent that an eddy current generated in one region does not flow into another region.

In addition, the second magnetic field having an intensity that cancels the first magnetic field denotes a magnetic field restraining an influence of the first magnetic field at a position where the magnetic detection element is disposed.

The magnetic sensor according to the embodiment of the invention is based on the following knowledge.

When a measurement target magnetic field is applied to a lead frame, an eddy current is generated in accordance with the intensity or the variation velocity of the measurement target magnetic field. Further, the eddy current generated in the lead frame generates a magnetic field in a direction opposite to an applying direction of the measurement target magnetic field.

In this regard, in the conventional magnetic sensor disclosed in Published Japanese Translation No. 2009-544149 of the PCT International Publication, a lead frame is divided into two parts due to a notch positioned in the middle, and a Hall element is disposed above the notch. For this reason, in an application of a measurement target magnetic field from below the notch to the magnetic field sensor in its entirety, this magnetic sensor generates no eddy current in the lead frame regarding the measurement target magnetic field itself passing through the notch, permitting accurate detection.

In an application of a measurement target magnetic field to the lead frame divided by the notch, however, since magnetic fields due to eddy currents respectively generated in the divided lead frames are individually applied to the magnetic detection element in an intensifying direction with respect to the measurement target magnetic field, overshooting is likely to occur in an output of the magnetic sensor, thereby leading to a deterioration of the transient response characteristics. Details will be given with reference to calculation results of transient response characteristics from each of analytical models illustrated below in FIGS. 8 to 10.

The magnetic sensor according to the embodiment of the invention thus includes a first region and a second region in a conductive substrate supporting a semiconductor device having a magnetic detection element formed on a surface of the semiconductor device. The first region is disposed in the vicinity of the magnetic detection element and generates a first magnetic field from a first eddy current generated by an application of a measurement target magnetic field. The second region is disposed away from the first region and generates a second magnetic field having an intensity that cancels the first magnetic field from a second eddy current generated by an application of the measurement target magnetic field.

Accordingly, in the magnetic sensor according to the embodiment of the invention, in an application of a measurement target magnetic field, the first magnetic field generated in the first region in a direction opposite to the direction of the measurement target magnetic field is canceled by the second magnetic field generated in the second region, and thus transient response characteristics can be improved.

In addition, a magnetic detection method according to the embodiment of the invention uses a magnetic sensor which includes a semiconductor device, a magnetic detection element formed on a surface of the semiconductor device, and a conductive substrate supporting the semiconductor device, and the conductive substrate includes a first region that is disposed in the vicinity of the magnetic detection element and a second region that is disposed away from the first region. The magnetic detection method includes generating a first magnetic field from a first eddy current generated by an application of a measurement target magnetic field in the first region, and generating a second magnetic field having an intensity that cancels the first magnetic field from a second eddy current generated by an application of the measurement target magnetic field in the second region.

Accordingly, in the magnetic detection method according to the embodiment of the invention, similar to the magnetic sensor according to the embodiment of the invention, it is possible to improve transient response characteristics with respect to a measurement target magnetic field.

Since the magnetic detection method according to the embodiment of the invention can be suitably performed using the magnetic sensor according to the embodiment of the invention, hereinafter, the magnetic detection method according to the embodiment of the invention will be described along with operation of the magnetic sensor according to the embodiment of the invention.

Next, embodiments of the magnetic sensor of the invention will be described with reference to the drawings.

Dimensions, material, and shape of each of constituent elements; relative disposition of each of the constituent elements; and the like illustrated in the embodiments as an example may be suitably changed depending on a constitution, various conditions, and the like of a device to which the invention is applied.

In each diagram, the same reference signs are applied to the same constituent parts, and duplicate description thereof may be omitted.

In addition, in the drawings, X direction, Y direction, and Z direction are orthogonal to each other. A direction including the X direction and a direction opposite to the X direction (negative X direction) will be referred to as "an X axis direction". A direction including the Y direction and a direction opposite to the Y direction (negative Y direction) will be referred to as "a Y axis direction". A direction including the Z direction and a direction opposite to the Z direction (negative Z direction) will be referred to as "a Z axis direction" (height direction or thickness direction).

Moreover, a plane including the X axis direction and the Y axis direction will be referred to as "an XY plane". A plane including the X axis direction and the Z axis direction will be referred to as "an XZ plane". A plane including the Y axis direction and the Z axis direction will be referred to as "a YZ plane".

First Embodiment

FIG. 1 is a transparent perspective view illustrating a magnetic sensor according to a first embodiment.

As illustrated in FIG. 1, a magnetic sensor 100 has a lead frame 110, a Hall integrated circuit (IC) 120, and a sealing resin 130.

The lead frame 110 includes a die pad 111 disposed in the middle, and a plurality of leads 112 disposed around the die pad 111. The lead frame 110 is realized by performing press working or the like of a thin plate of a Cu alloy having a thickness of approximately 130 µm.

Since the die pad 111 serving as a conductive substrate supports the Hall IC 120 using a conductive adhesive 140 for firm attachment, a place where the Hall IC 120 is firmly attached has a flat plate shape.

The Hall IC 120 is a chip-shaped semiconductor device in which a Hall element 121 serving as a magnetic detection element is formed on a semiconductor substrate having a thickness of 150 μm in the vicinity of the center on a surface of the semiconductor substrate. The Hall IC 120 includes a circuit for operating the Hall element 121 and outputs a voltage corresponding to the intensity of a measurement target magnetic field detected by the Hall element 121.

In addition, a plurality of bonding pads is formed on the surface of the Hall IC 120. The plurality of bonding pads is electrically connected to the plurality of leads 112, respectively, by Au wires 150 through wire bonding.

Specifically, the sealing resin 130 is an insulating epoxy resin or the like and is hardened such that the die pad 111, a part of the leads 112, the Hall IC 120, and the Au wires 150 are covered. In addition, portions of the leads 112 which are not covered by the sealing resin 130 are used as outer leads, such as a power supply terminal, a GND terminal, an output terminal, and a function switching terminal of the magnetic sensor 100.

Figure 2:
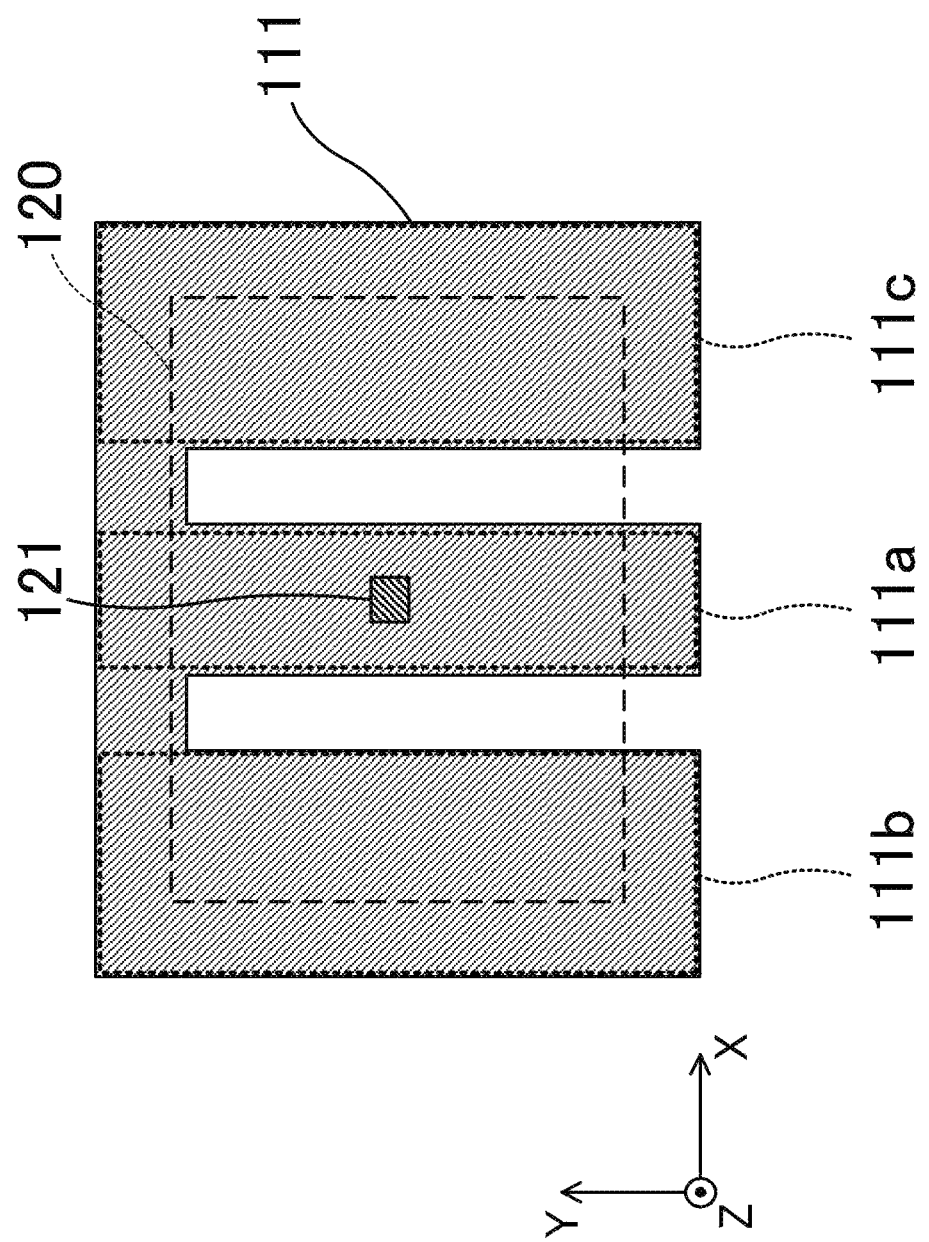
FIG. 2 is a transparent top view illustrating the magnetic sensor according to the first embodiment.

FIG. 2 is a transparent top view illustrating the magnetic sensor according to the first embodiment. FIG. 2 mainly illustrates a positional relationship between the die pad 111 and the Hall element 121 disposed on a surface of the Hall IC 120. In FIG. 2, the dotted line indicates an outline of the Hall IC 120 mounted on the die pad 111.

As illustrated in FIG. 2, the die pad 111 is separated and divided into a first region 111a in the middle and second regions 111b and 111c at both ends of the first region by two notches. In addition, an area of the first region 111a is narrower than areas of the second regions 111b and 111c.

The Hall IC 120 is mounted such that the Hall element 121 is positioned in the middle of the first region 111a. That is, regarding the die pad 111, the die pad 111 has a shape with line symmetry when viewed in a plan view, and the Hall element 121 is disposed on a symmetric axis of the line symmetry.

Figure 3:
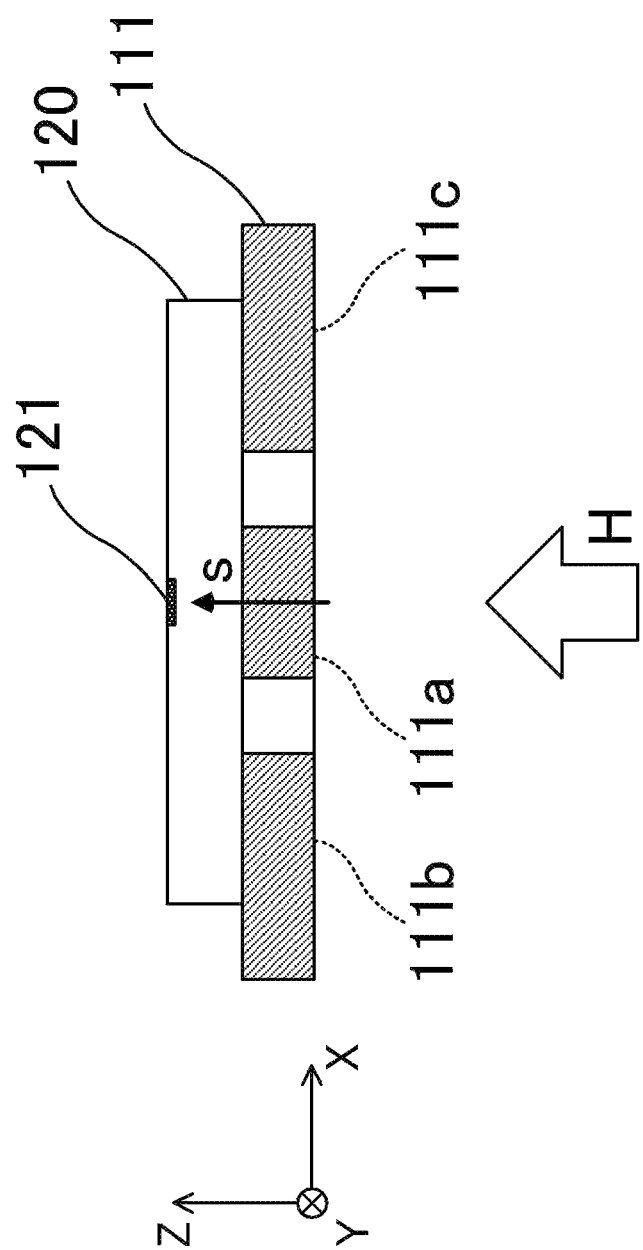
FIG. 3 is a transparent side view illustrating the magnetic sensor according to the first embodiment.

FIG. 3 is a transparent side view illustrating the magnetic sensor according to the first embodiment and is a view when the die pad 111 and the Hall IC 120 illustrated in FIG. 2 are viewed in the positive Y axis direction.

As illustrated in FIG. 3, the Hall IC 120 is mounted on the die pad 111 such that the Hall element 121 is positioned in the middle of the first region 111a in the positive Z axis direction. In addition, a magnetism sensing direction s that is a direction in which the Hall element 121 has the greatest detection sensitivity is the positive Z axis direction. That is, the Hall element 121 has directivity. The first region 111a is disposed in the magnetism sensing direction in which the Hall element 121 has the greatest sensitivity from a position of the Hall element 121, and the second regions 111b and 111c are not disposed in the magnetism sensing direction from the position of the Hall element 121.

Figure 4:
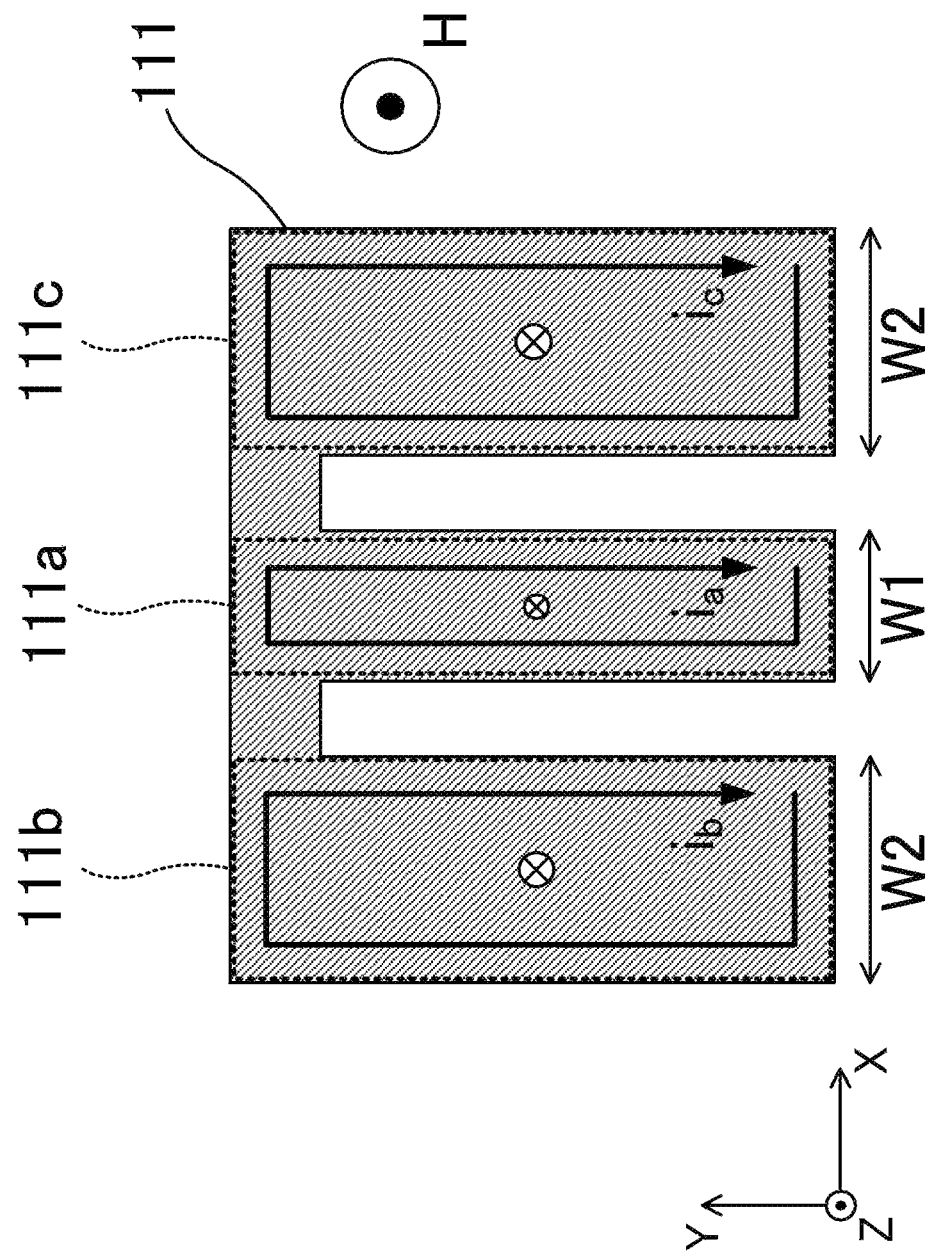
FIG. 4 is an explanatory view illustrating a flow of an eddy current generated in a die pad in the magnetic sensor according to the first embodiment.

Here, on the assumption that a measurement target magnetic field H is evenly applied to the die pad 111 and the Hall IC 120 in the positive Z axis direction, eddy currents are generated in the first region 111a and the second regions 111b and 111c of the die pad 111 as in FIG. 4.

FIG. 4 is an explanatory view illustrating a flow of an eddy current generated in the die pad of the magnetic sensor according to the first embodiment.

As illustrated in FIG. 4, when the measurement target magnetic field H is evenly applied in the positive Z axis direction, an eddy current $i_a$ is generated in the first region 111a in the middle, having a magnitude corresponding to the width W1 of the first region 111a, and a magnetic field due to the eddy current $i_a$ is generated in the negative Z axis direction. In addition, eddy currents $i_b$ and $i_c$ are respectively generated in the second regions 111b and 111c on both sides of the first region, having magnitudes corresponding to the width W2 of the second regions and magnetic fields due to the eddy currents $i_b$ and $i_c$ are respectively generated in the negative Z axis direction.

Since the first region 111a and the second regions 111b and 111c are separated respectively by two notches, eddy currents generated in the regions are prevented from flowing into other regions.

Figure 5:
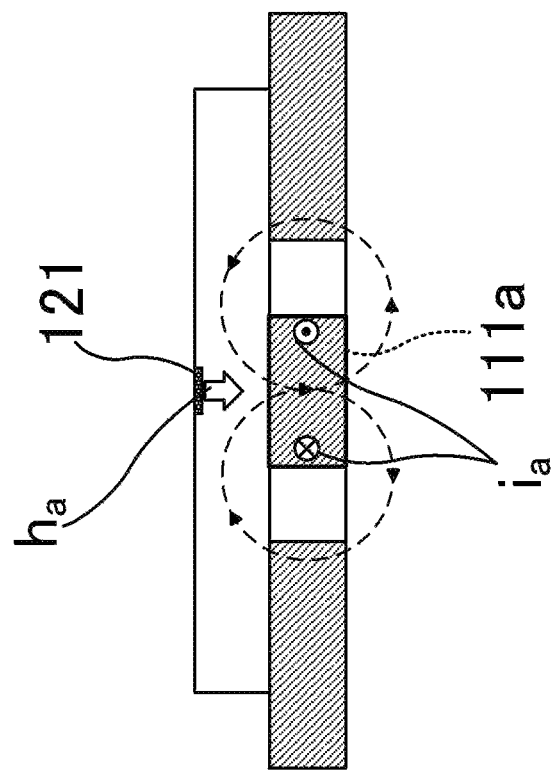
FIG. 5 is a transparent side view illustrating a magnetic field generated in a first region in the magnetic sensor according to the first embodiment.
Figure 6:
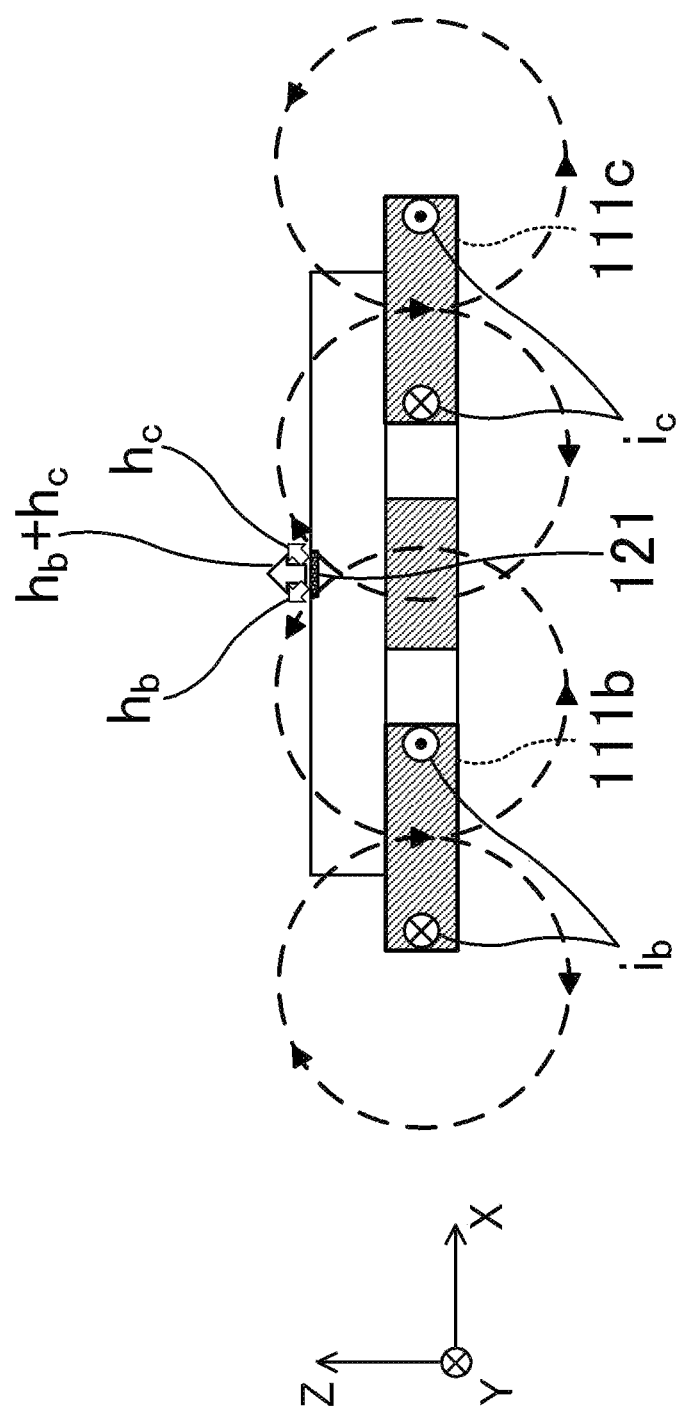
FIG. 6 is a transparent side view illustrating magnetic fields generated in second regions in the magnetic sensor according to the first embodiment.

Then, as illustrated in FIG. 5, due to the eddy current $i_a$ generated in the first region 111a, a first magnetic field $h_a$ is applied to the Hall element 121 in the negative Z axis direction. In addition, as illustrated in FIG. 6, due to the eddy currents $i_b$ and $i_c$ respectively generated in the second regions 111b and 111c, magnetic fields $h_b$ and $h_c$ are respectively generated in directions along the magnetic fields of the eddy currents $i_b$ and $i_c$, and a second magnetic field $h_b+h_c$ that is a composite magnetic field of $h_b$ and $h_c$ is applied to the Hall element 121 in the positive Z axis direction.

Since the area of the first region 111a is narrower than the areas of the second regions 111b and 111c, the composite magnetic field due to the second regions 111b and 111c is more intense than the magnetic field due to the eddy current $i_a$ in the first region 111a. However, due to the positional relationship between the regions and the Hall element 121, the intensities of the magnetic fields are likely to be equivalent to each other and can easily cancel each other out at the position of the Hall element 121.

In addition, in the present embodiment, since the magnetic detection element is the Hall element 121, the component of the first magnetic field $h_a$ in the Z axis direction need only be canceled by the component of the second magnetic field $h_b+h_c$ in the Z axis direction at the installation position of the Hall element 121. In addition, provided that the magnetic detection element has no directivity, the first magnetic field $h_a$ is canceled by the second magnetic field $h_b+h_c$ having the same intensity in the opposite direction at the position of the magnetic detection element.

Figure 7:
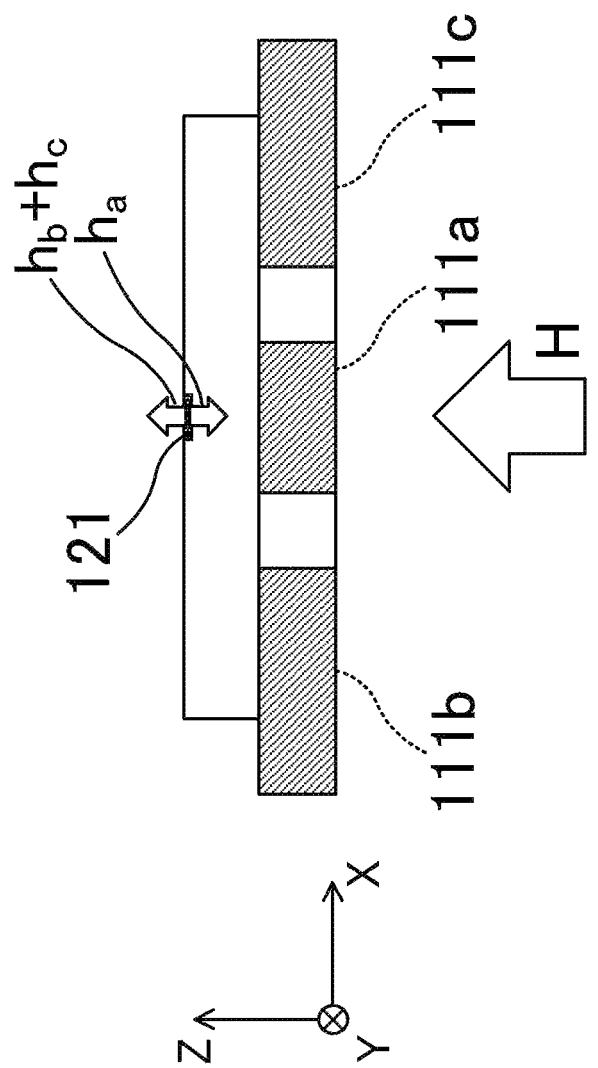
FIG. 7 is an explanatory view illustrating a magnetic field due to an eddy current generated in each region in the die pad in the magnetic sensor according to the first embodiment.

In the present embodiment, as illustrated in FIG. 7, in the application of the measurement target magnetic field H the first magnetic field $h_a$ generated in a direction opposite to the direction of the measurement target magnetic field H in the first region 111a is canceled by the second magnetic field $h_b+h_c$ generated in the second regions 111b and 111c at the position of the Hall element 121, and thus transient response characteristics can be improved.

In addition, when the die pad 111 is viewed in a plan view, provided that the die pad 111 has a shape with line symmetry and the center of the Hall element 121 is disposed on the symmetric axis of the line symmetry, the first magnetic field $h_a$ has only a component in the negative Z axis direction with respect to the Hall element 121, and the second magnetic field $h_b+h_c$ (composite magnetic field) has only a component in the positive Z axis direction with respect to the Hall element 121. For this reason, it is advantageous in facilitating the design in which the first magnetic field $h_a$ is canceled by the second magnetic field $h_b+h_c$ at the position of the Hall element 121.

Examples of a method for adjusting the intensity of the second magnetic field to an intensity for canceling the first magnetic field include a method for adjusting an area and a thickness of each of the regions, distances between the first region and the second regions, and the like on the basis of results obtained through a commercially available numerical simulation or the like.

[Numerical Simulation]

Next, results calculated through numerical simulation using a finite element method will be described with reference to FIGS. 8 to 10.

Figure 8:
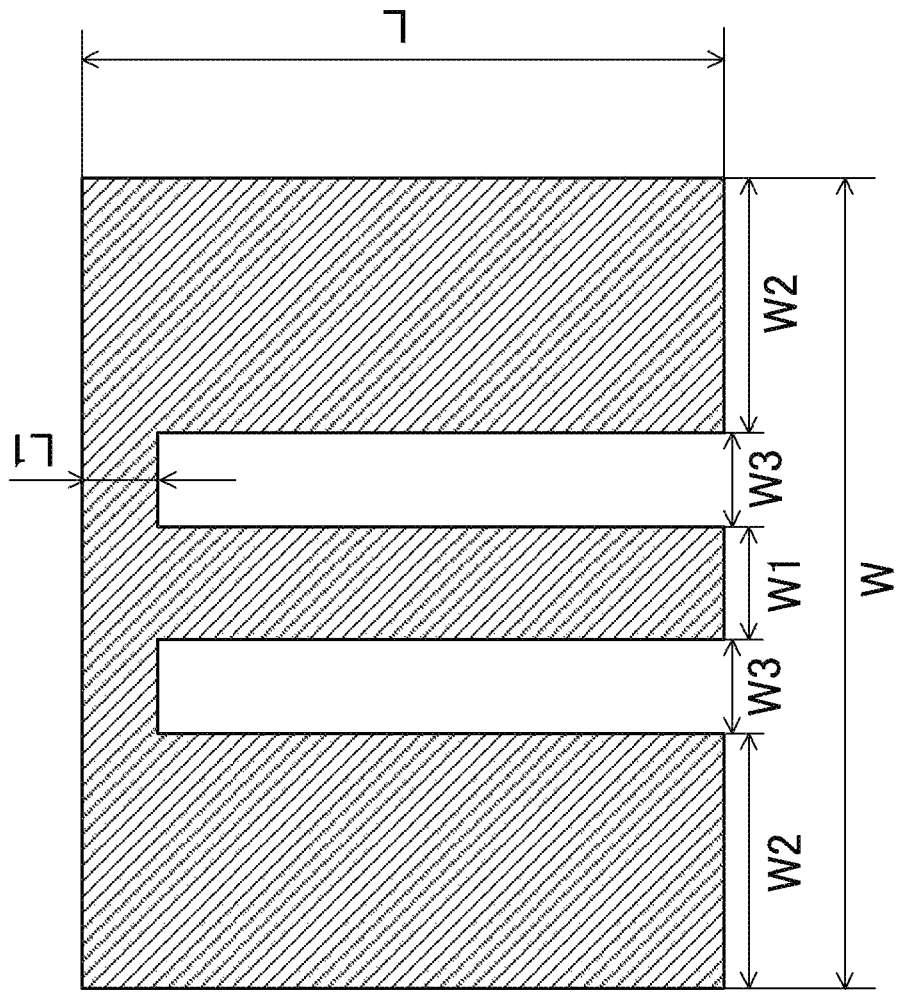
FIG. 8 is an explanatory view illustrating an analytical model of the magnetic sensor according to the first embodiment.

FIG. 8 is an explanatory view illustrating an analytical model of the magnetic sensor according to the first embodiment and illustrates an analytical model of a die pad as an example.

The analytical model of the die pad has a rectangular external form in a plan view provided with two notches. Each of dimensions is set as follows. The thickness is set to 130 μm, and the volume resistivity is set to 0.023 μΩm.

L: 1,700 μm (dimension of one side in the die pad)

L1: 200 μm (widths of portions connecting the first region to the second regions)

W: 2,150 μm (dimension of other side in the die pad)

W1: 300 μm (dimension of one side of a portion corresponding to the first region)

W2: 675 μm (dimension of one side of each the portions corresponding to the second regions)

W3: 250 μm (dimensions of gaps between the first region and the second regions)

A probe position (corresponding to a position where the Hall element is disposed) where the intensity of a magnetic field is calculated is set to 150 μm above the surface of the die pad at the center.

Figure 9:
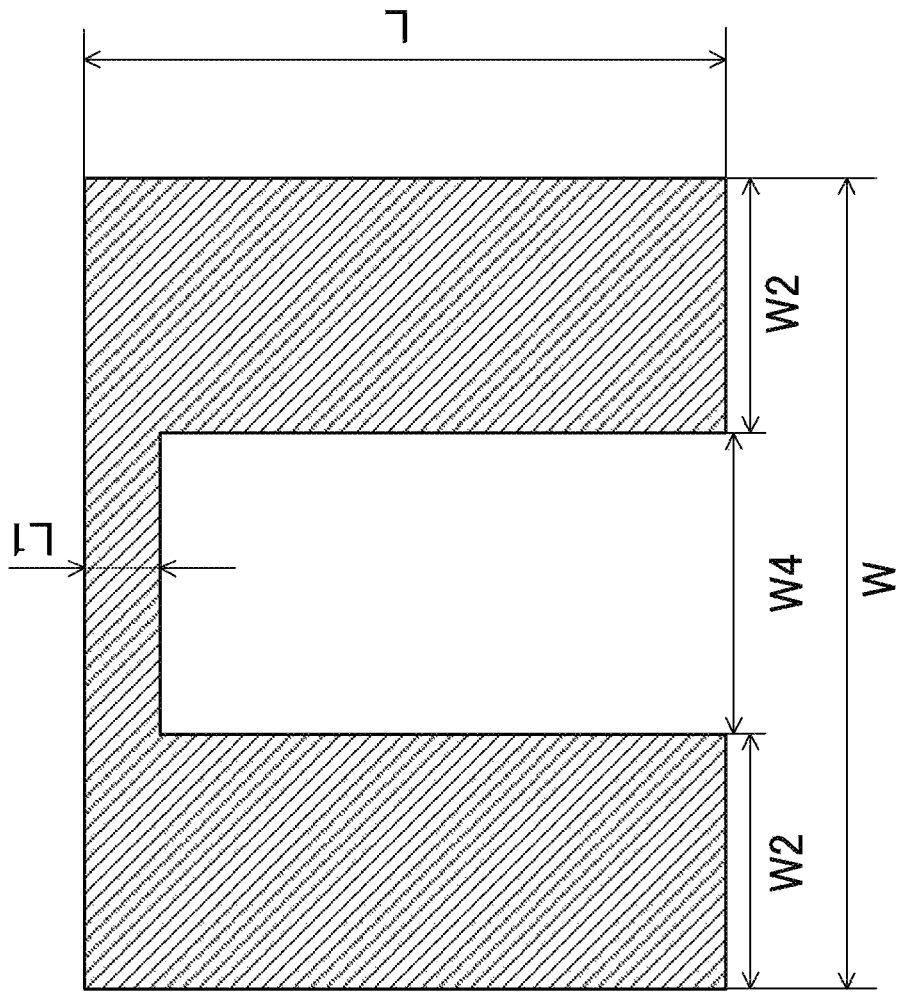
FIG. 9 is an explanatory view illustrating an analytical model of a magnetic sensor in the related art.

FIG. 9 is an explanatory view illustrating an analytical model of a magnetic sensor in the related art and illustrates an analytical model as a comparative example.

The analytical model as the comparative example is an analytical model similar to that in the example except that the portions connecting the first region and the second regions to each other in the example remain and a portion corresponding to the first region is removed. For this reason, W4 that is a dimension of the gap between the portions corresponding to the second regions can be obtained by the following expression W−W2×2, and it is 800 μm.

Figure 10:
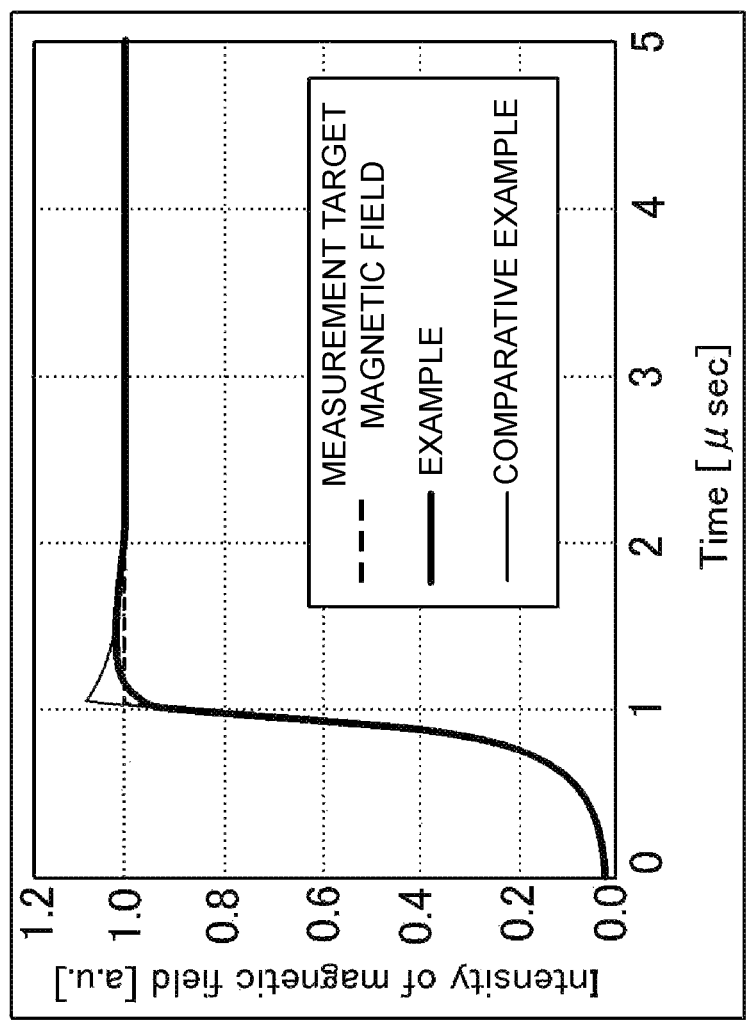
FIG. 10 is a graph illustrating calculation results of transient response characteristics from each of the analytical models illustrated in FIGS. 8 and 9.

FIG. 10 is a graph illustrating calculation results of transient response characteristics using the analytical models illustrated in FIGS. 8 and 9. The vertical axis indicates intensity of a magnetic field (arbitrary unit: a.u.) at the position of the Hall element, and the horizontal axis indicates time (μsec). In FIG. 10, a measurement target magnetic field applied to each of the analytical models is indicated by the dotted line, the calculation result of the example is indicated by the bold line, and the calculation result of the comparative example is indicated by the thin line. The applying direction of the measurement target magnetic field is set to the positive Z axis direction.

As illustrated in FIG. 10, regarding the intensity of a magnetic field at the probe position in the example, it can be seen that overshooting has become relatively small after 1 μsec that is a rising time of a measurement target magnetic field (DC magnetic field) and follows the measurement target magnetic field.

It is assumed that this is because, as illustrated in FIG. 7, transient response characteristics with respect to the measurement target magnetic field H can be improved by canceling the first magnetic field $h_a$ by means of the second magnetic field $h_b+h_c$.

Returning to FIG. 10, the intensity of a magnetic field at the probe position in the comparative example shows a significant overshooting occurs after 1 μsec and does not follow the measurement target magnetic field.

It is assumed that this is because, as in FIG. 7, only the second magnetic field $h_b+h_c$ is generated and this second magnetic field $h_b+h_c$ is superimposed on the measurement target magnetic field H in the intensifying direction, and thus overshooting occurs in the output and transient response characteristics with respect to the measurement target magnetic field H deteriorate.

[Regarding Measure for Low Profile]

Next, a case in which the magnetic sensor is used as a current detector for detecting a current flowing through a conductor will be taken into consideration. In such a case, the magnetic sensor is inserted into a gap of a columnar open-magnetic-path core covering the conductor and functions as a current detector for measuring a magnetic field generated by a current flowing through the conductor. For this reason, since a narrower gap between the open-magnetic-path cores has less leakage of a magnetic flux and a magnetic field generated due to a current can be more accurately measured, the magnetic sensor is required to have a low profile.

Also in this regard, in the magnetic sensor in the related art disclosed in Published Japanese Translation No. 2009-544149 of the PCT International Publication, even though a semiconductor chip is thinned for a low profile, the Hall element formed on a surface of the semiconductor chip becomes close to the lead frame so that a magnetic field generated due to an eddy current is detected in a direction in which the sensitivity becomes the greatest, thereby further increasing overshooting. Specifically, it will be described as follows.

Figure 11:
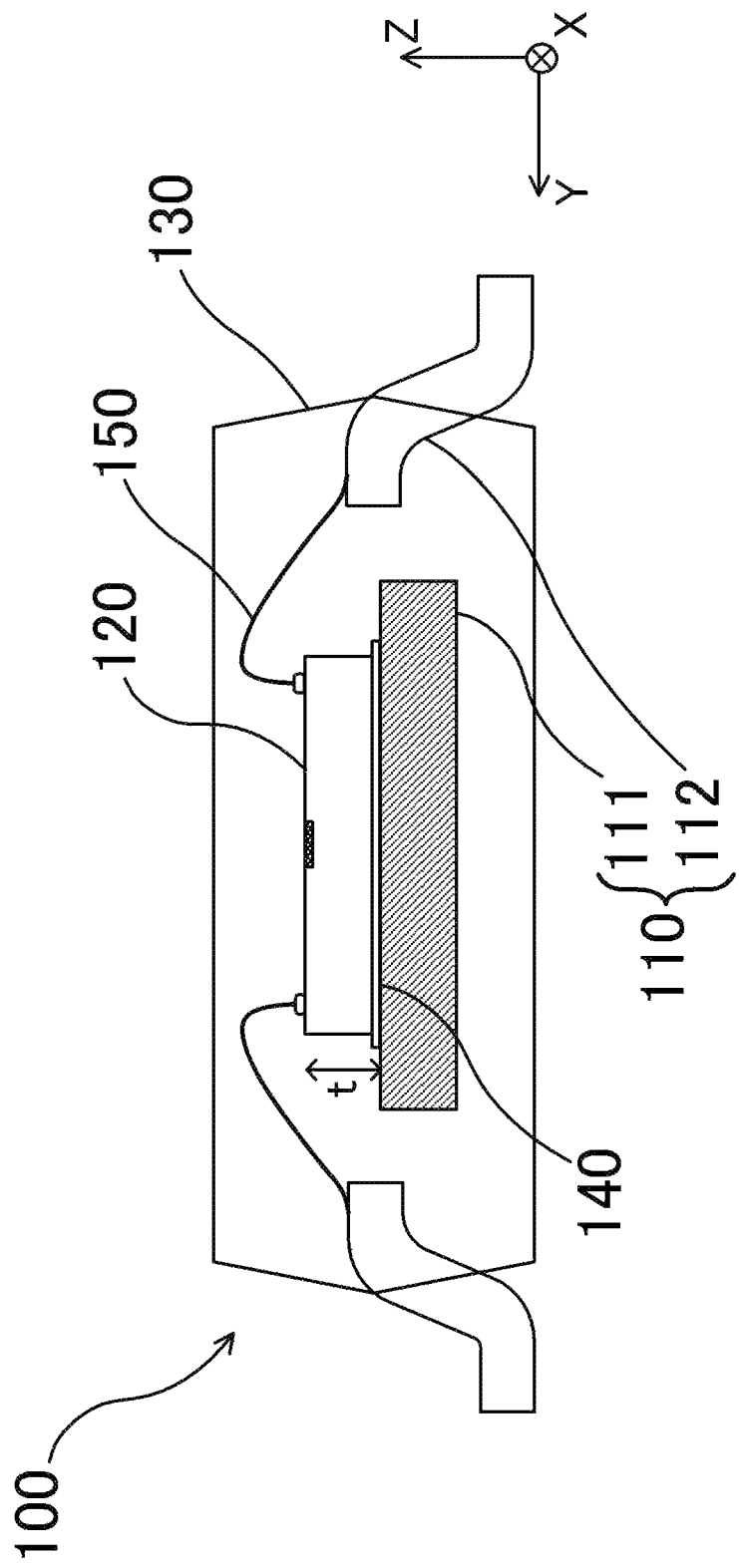
FIG. 11 is another transparent side view illustrating the magnetic sensor according to the first embodiment.

FIG. 11 is a transparent side view illustrating the magnetic sensor according to the first embodiment and is a view when FIG. 1 is viewed in a positive X axis direction.

Figure 12:
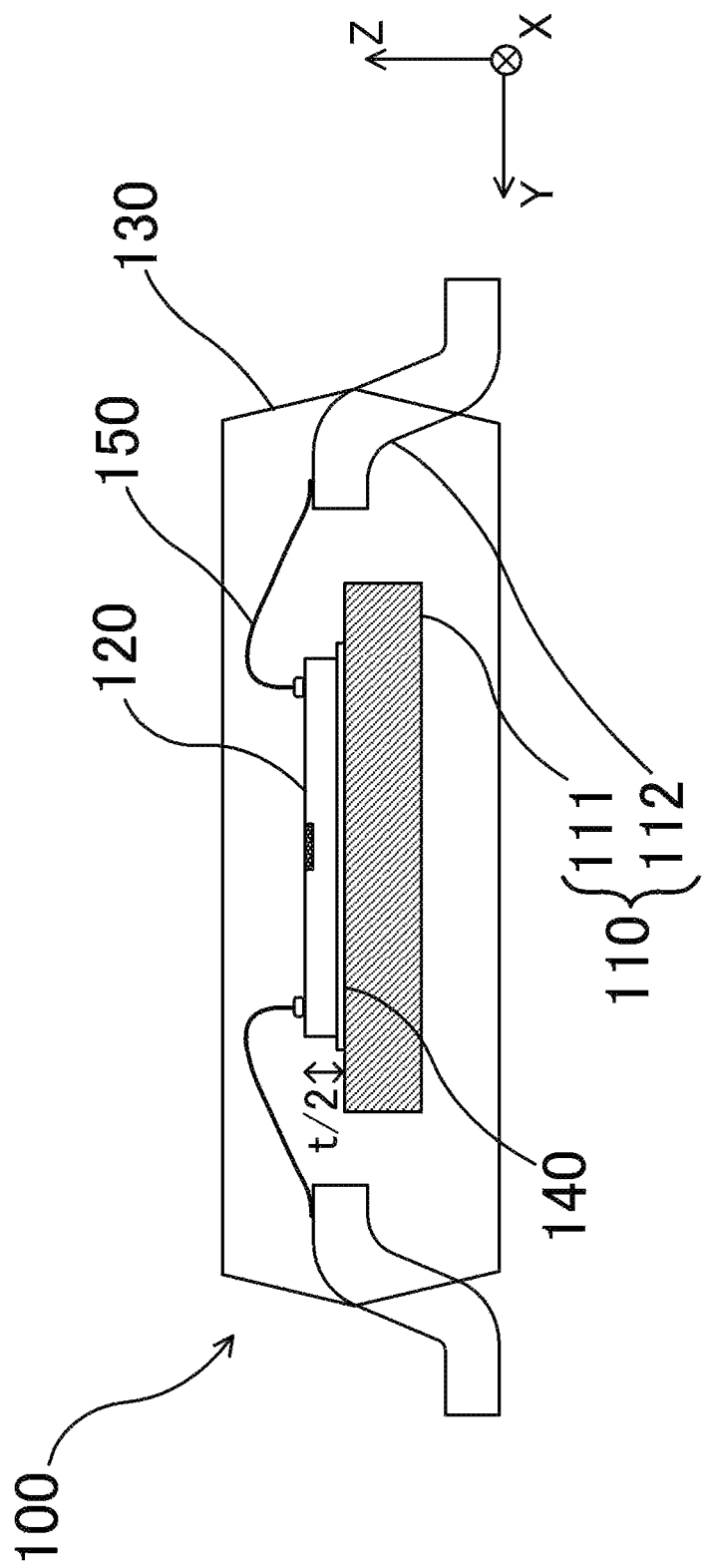
FIG. 12 is a transparent side view when a semiconductor chip is thinned to have a low profile in the magnetic sensor according to the first embodiment.
Figure 13:
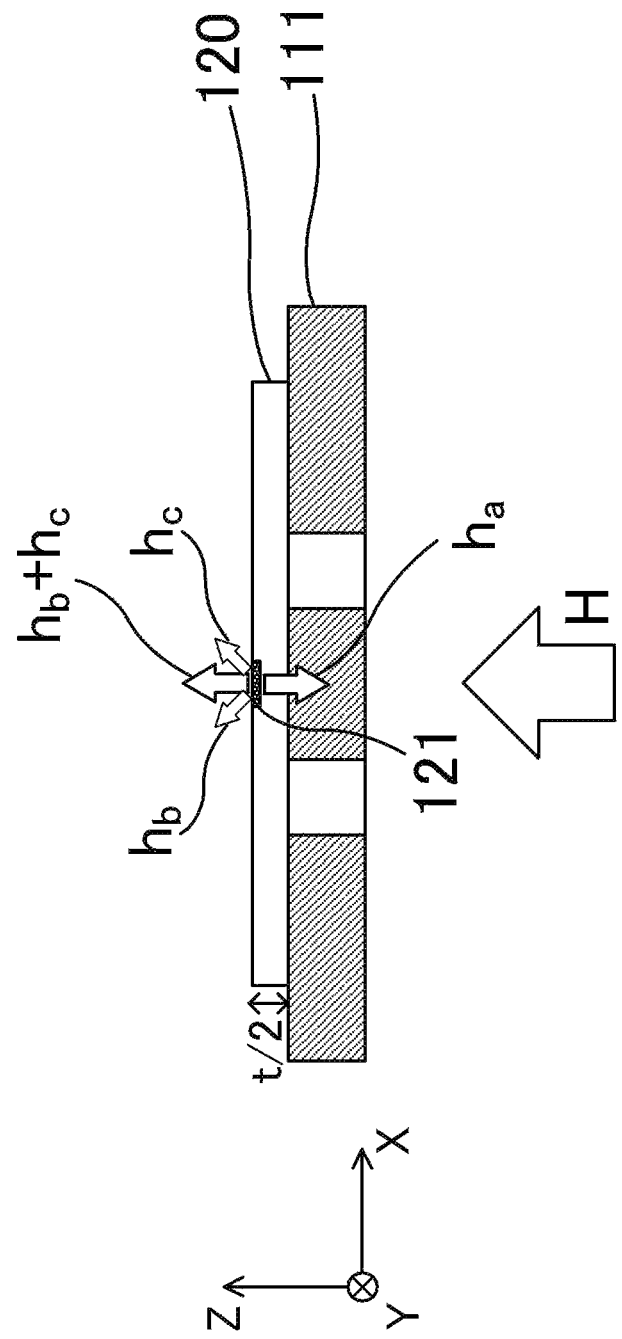
FIG. 13 is an explanatory view illustrating a magnetic field applied to a magnetic detection element when the semiconductor chip has a low profile in the magnetic sensor according to the first embodiment.

As illustrated in FIG. 11, when the thickness of the Hall IC 120 is t, and when the thickness of the Hall IC 120 is thinned to t/2 for a low profile by adjusting the amount of backgrinding or the like, it becomes as illustrated in FIG. 12. At this time, as illustrated in FIG. 13, since the Hall element 121 becomes closer to the first region 111a, the first magnetic field $h_a$ is more intense than that when the thickness of the Hall IC 120 is t. In addition, when the Hall element 121 becomes closer to the second regions 111b and 111c, the second magnetic field $h_b+h_c$ is intense because each component of the magnetic fields $h_b$ and $h_c$ in the positive Z axis direction further increases than that when the thickness of the Hall IC 120 is t.

For this reason, in the magnetic sensor 100, even if the Hall IC 120 is thinned for a low profile, both the first magnetic field $h_a$ and the second magnetic field $h_b+h_c$ are intense. Therefore, the first magnetic field $h_a$ can be easily canceled by the second magnetic field $h_b+h_c$ through adjustment or the like of the dimensions of the lead frame.

On the other hand, in the magnetic sensor in the related art disclosed in Patent Document 1, when the thickness of the Hall IC 120 is set to t/2, only the intense second magnetic field $h_b+h_c$ is generated. Therefore, greater overshooting than that when the thickness of the Hall IC 120 is t occurs, and thus transient response characteristics with respect to the measurement target magnetic field H further deteriorate. Moreover, when W4 that is the dimension of the gap between the portions illustrated in FIG. 9 is widened in order to avoid deterioration in transient response characteristics, reliability is degraded due to decrease in rigidity of the lead frame or an adhesive area between the semiconductor substrate and the lead frame.

Even if the Hall IC 120 is thinned for a low profile in the magnetic sensor 100, different from the magnetic sensor in the related art in which transient response characteristics further deteriorate or reliability is degraded in order for avoidance, transient response characteristics can be improved without degrading reliability.

Modification Example 1 of First Embodiment

Figure 14:
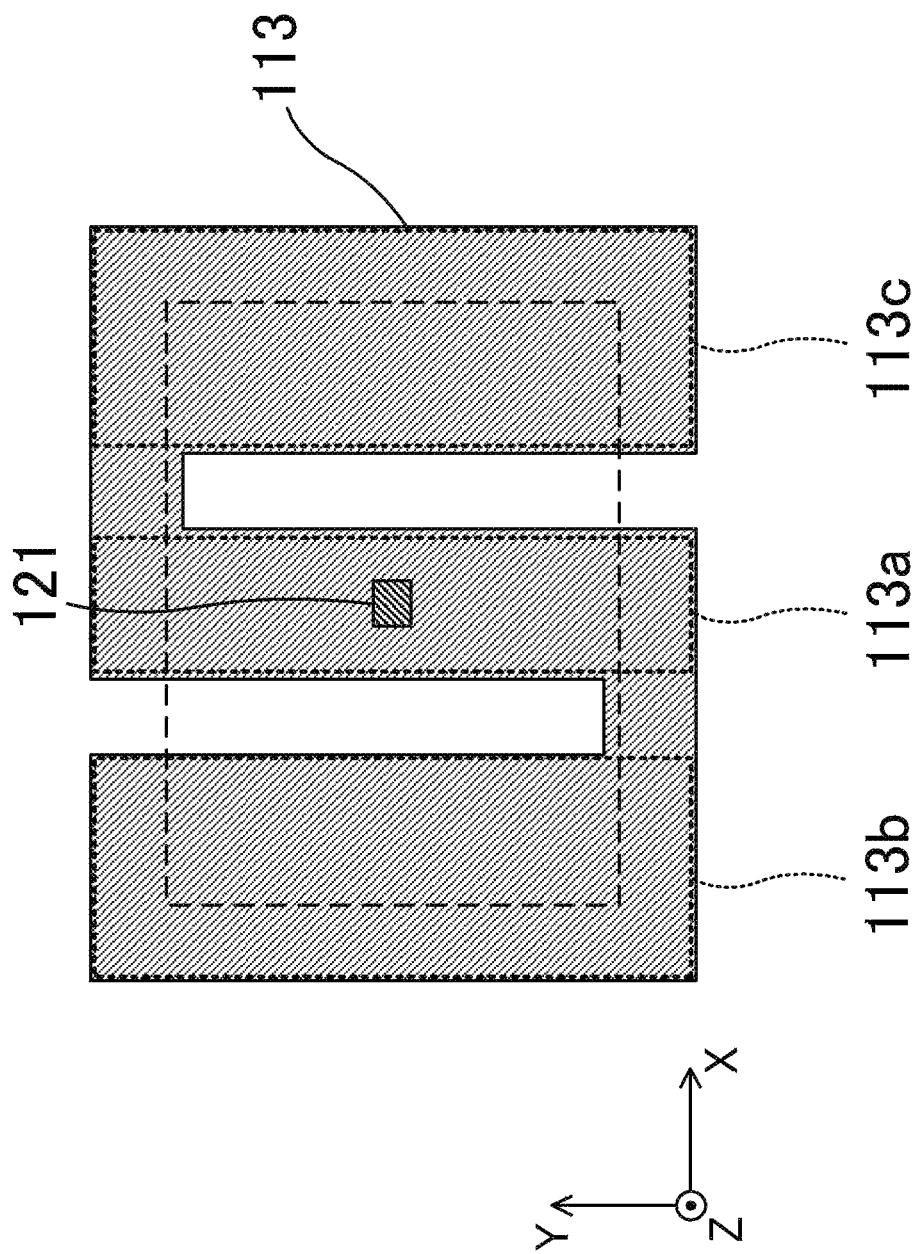
FIG. 14 is a transparent top view illustrating Modification example 1 of the magnetic sensor according to the first embodiment.

FIG. 14 is a transparent top view illustrating Modification example 1 of the magnetic sensor according to the first embodiment.

As illustrated in FIG. 14, in a die pad 113 in a plan view in this Modification example 1, a first region 113a and second regions 113b and 113c are separated from each other while having a shape in which directions of two notches are not aligned instead of having two notches in aligned directions. That is, when the die pad 113 is viewed in a plan view, if the die pad 113 has a shape with point symmetry and the center of the Hall element 121 is disposed on the center point of the point symmetry, similar to the foregoing embodiment, the first magnetic field $h_a$ has only a component in the negative Z axis direction with respect to the Hall element 121, and thus the second magnetic field $h_b+h_c$ (composite magnetic field) has only a component in the positive Z axis direction with respect to the Hall element 121. For this reason, it is advantageous in facilitating the design in which the first magnetic field $h_a$ is canceled by the second magnetic field $h_b+h_c$ at the position of the Hall element 121.

Modification Example 2 of First Embodiment

Figure 15:
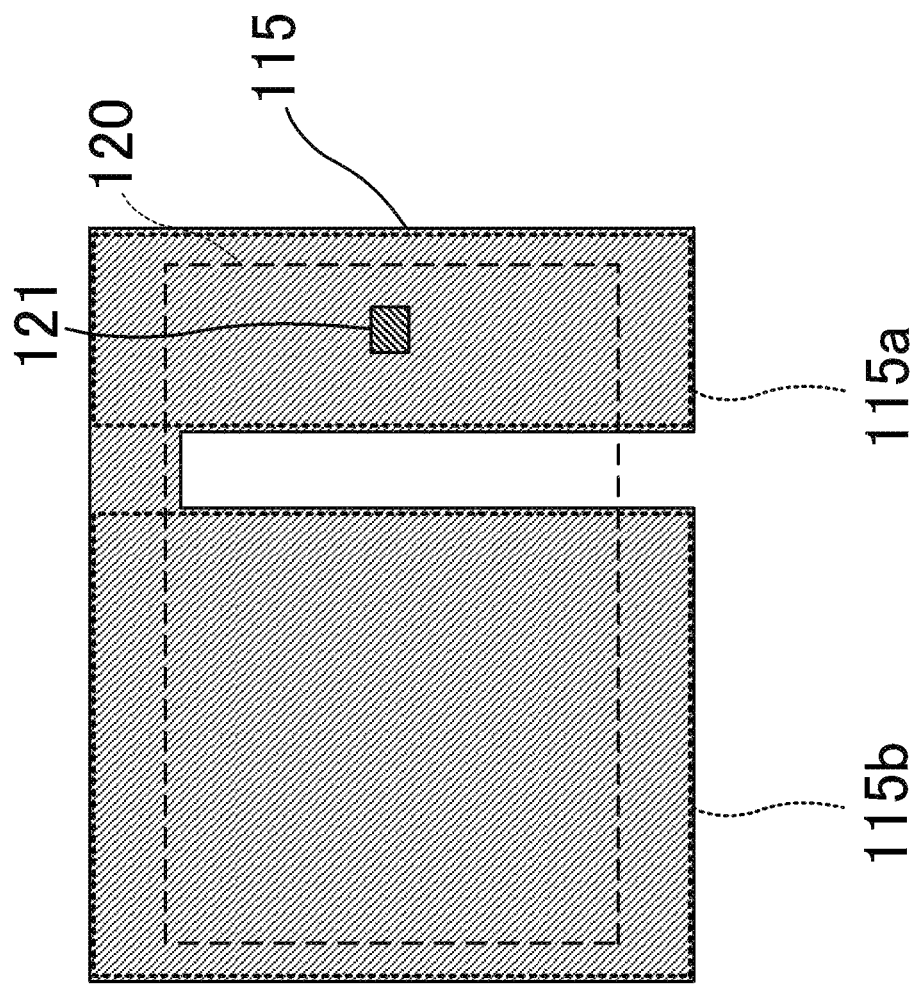
FIG. 15 is a transparent top view illustrating Modification example 2 of the magnetic sensor according to the first embodiment.

FIG. 15 is a transparent top view illustrating Modification example 2 of the magnetic sensor according to the first embodiment.

The die pad may have a shape which is not line symmetry in a plan view. For example, as illustrated in FIG. 15, a case in which the Hall element 121 is positioned such that it is biased to the positive X axis direction side from the center of the Hall IC 120 will be taken into consideration. In such a case, a die pad 115 is divided into a first region 115a and a second region 115b due to one notch, and the Hall IC 120 is mounted on the die pad 115 such that the Hall IC 120 is positioned at the center of the first region 115a. At this time, if a measurement target magnetic field is applied to the positive Z axis direction, the first magnetic field generated in a direction opposite to the direction of a measurement target magnetic field generated in the first region 115a can be canceled by the second magnetic field generated in one second region 115b at the position of the Hall element 121.

Second Embodiment

In the first embodiment, if the mounting position of the Hall IC deviates with respect to the die pad, the position of the Hall element deviates so that the intensities of the first magnetic field and the second magnetic field at the position of the Hall element vary, and thus it may be difficult to accurately cancel the first magnetic field.

Figure 16:
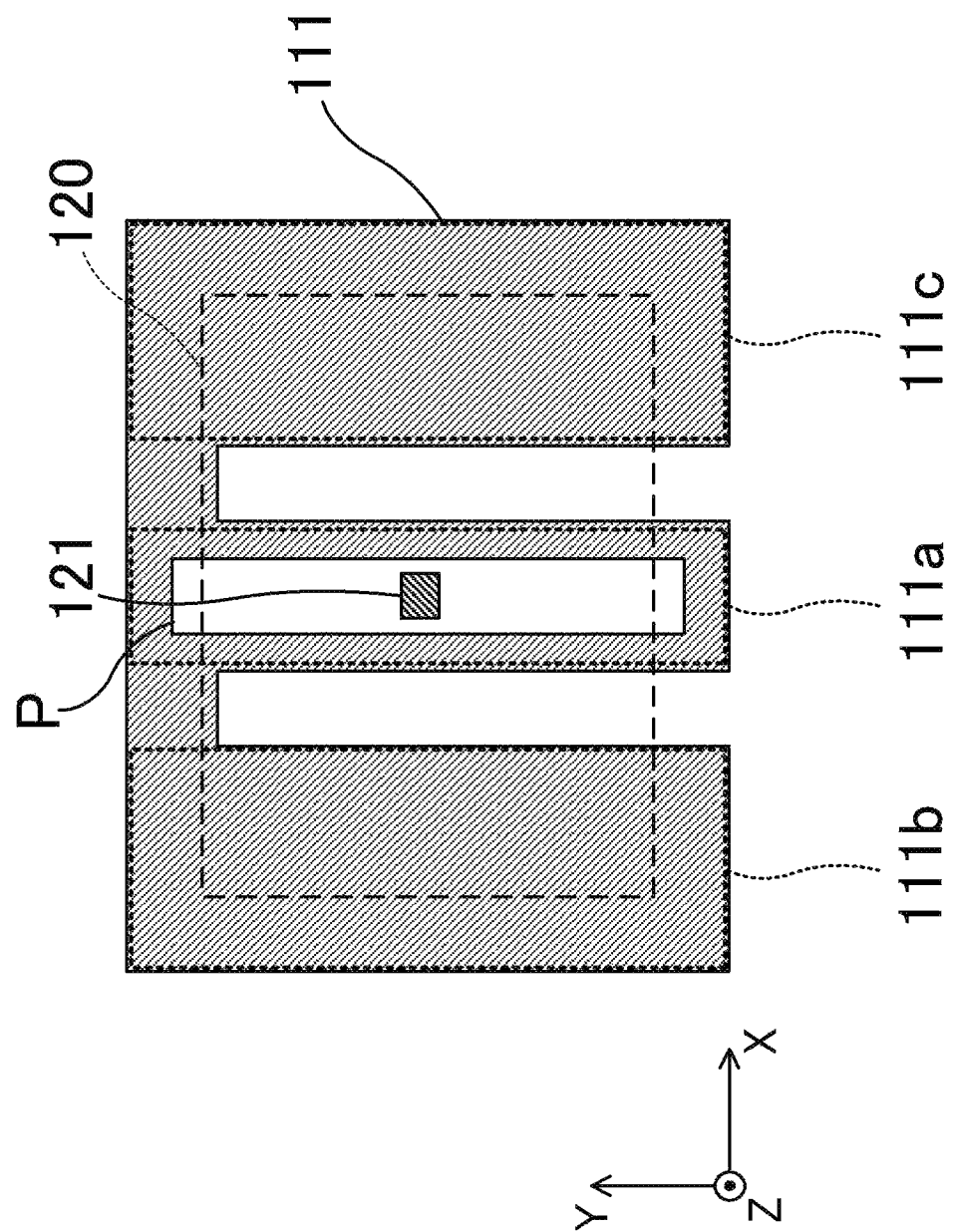
FIG. 16 is a transparent top view illustrating a magnetic sensor according to a second embodiment.
Figure 17:
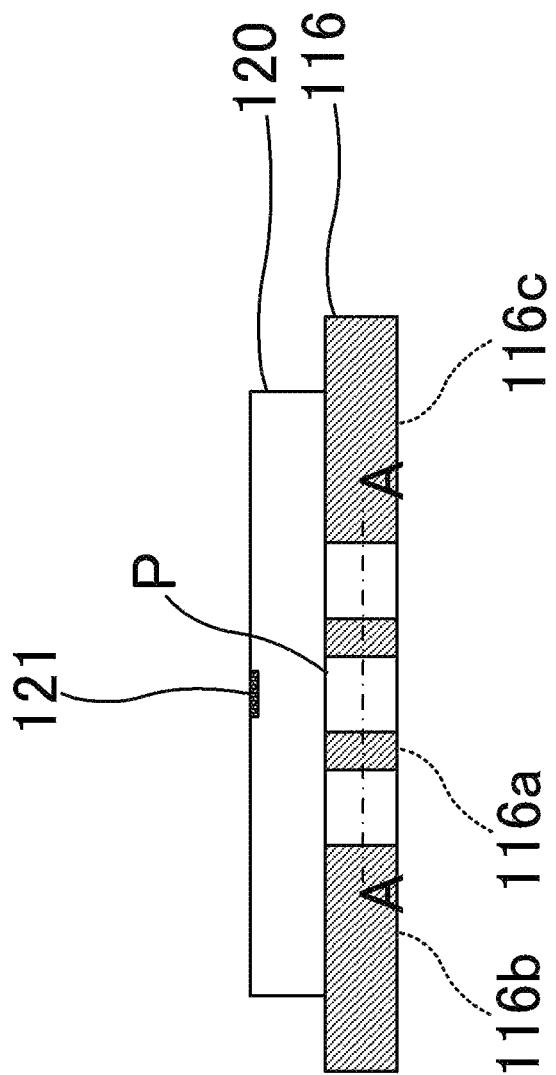
FIG. 17 is a transparent side view of the magnetic sensor according to the second embodiment.

Hereupon, in a second embodiment, as illustrated in FIGS. 16 and 17, the constitution in the first embodiment is provided with a penetration hole P such that the closest place from the Hall element 121 is included in a first region 116a of a die pad 116. The die pad 116 is divided into a first region 116a and second regions 116b, 116c.

Accordingly, the density of an eddy current can be made zero at the place where the penetration hole P is provided. Therefore, the peak intensity of a magnetic field generated in an eddy current can be restrained and made flat.

Therefore, in the magnetic sensor of the second embodiment, the peak of an intensity distribution of magnetic fields generated due to eddy currents in the first region can be made flat by providing a penetration hole in the first region in the vicinity of the Hall element. For this reason, in the magnetic sensor of the second embodiment, even if the position where the Hall IC is mounted deviates with respect to the die pad, variation in the magnetic field due to the eddy current received by the Hall element does not become significant. Transient response characteristics can thus be less likely to become inconsistent.

Specifically, description will be given as follows using results of numerical simulation.

Figure 18:
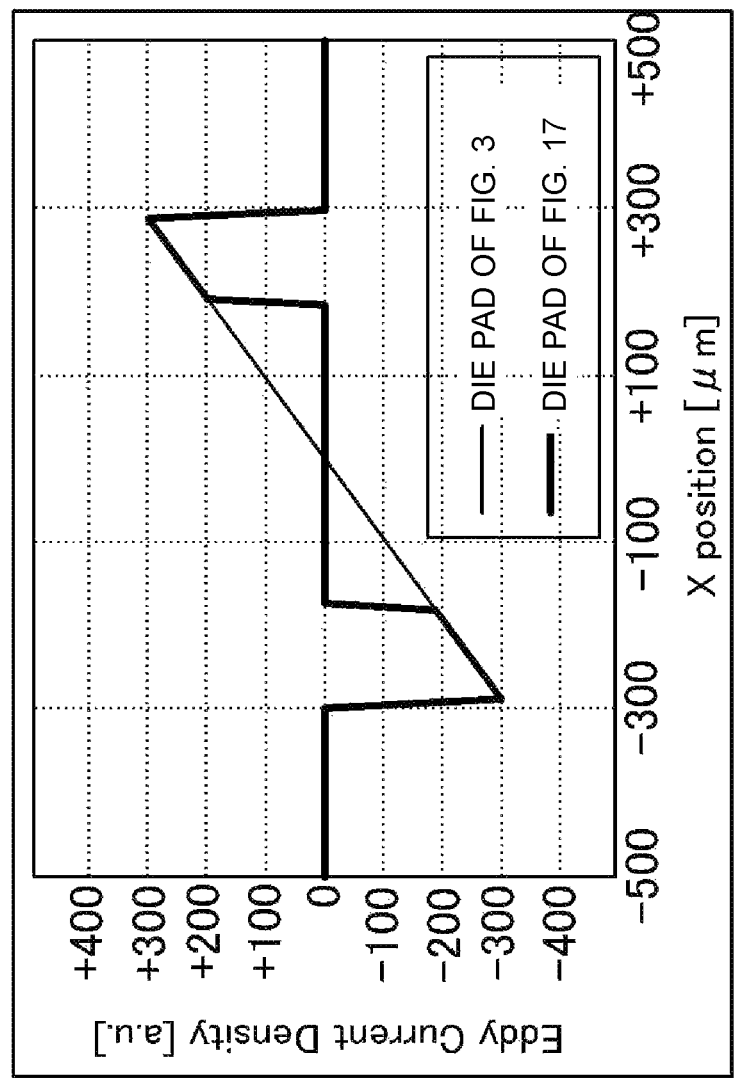
FIG. 18 is a graph illustrating calculation results of a density of an eddy current generated in the A-A cross section in FIG. 17.

FIG. 18 is a graph illustrating calculation results of a density of an eddy current generated along line A-A in FIG. 17 and obtained through numerical simulation using a two-dimensional finite element method. In addition, in FIG. 18, the vertical axis indicates density of eddy current (arbitrary unit: a.u.), and the horizontal axis indicates position (μm) in the X axis direction while having the center of the first region as zero. In FIG. 18, the calculation result of the analytical model using the die pad of FIG. 17 according to the second embodiment is indicated by the bold line, and the calculation result of the analytical model using the die pad illustrated in FIG. 3 according to the first embodiment for comparison is indicated by the thin line. All the widths of the first regions are set within a range of −300 μm to +300 μm, and the width of the penetration hole provided in the die pad in the second embodiment is set within a range of −200 μm to +200 μm.

As illustrated in FIG. 18, in the die pad of FIG. 3 in which no penetration hole is provided, the density of an eddy current has a negative value at a position where the X axis is −300 μm, and the density of an eddy current has a positive value at a position of +300 μm. This indicates that the direction of an eddy current at the position of −300 μm is a direction opposite to the direction of an eddy current at the position of +300 μm. It can be seen that the density of an eddy current linearly increases between the position of −300 μm and the position of +300 μM.

In the die pad of FIG. 17 in which a penetration hole is provided, since a penetration hole is provided, it can be seen that the density of an eddy current has become zero between the position of −200 μm and the position of +200 μm.

Figure 19:
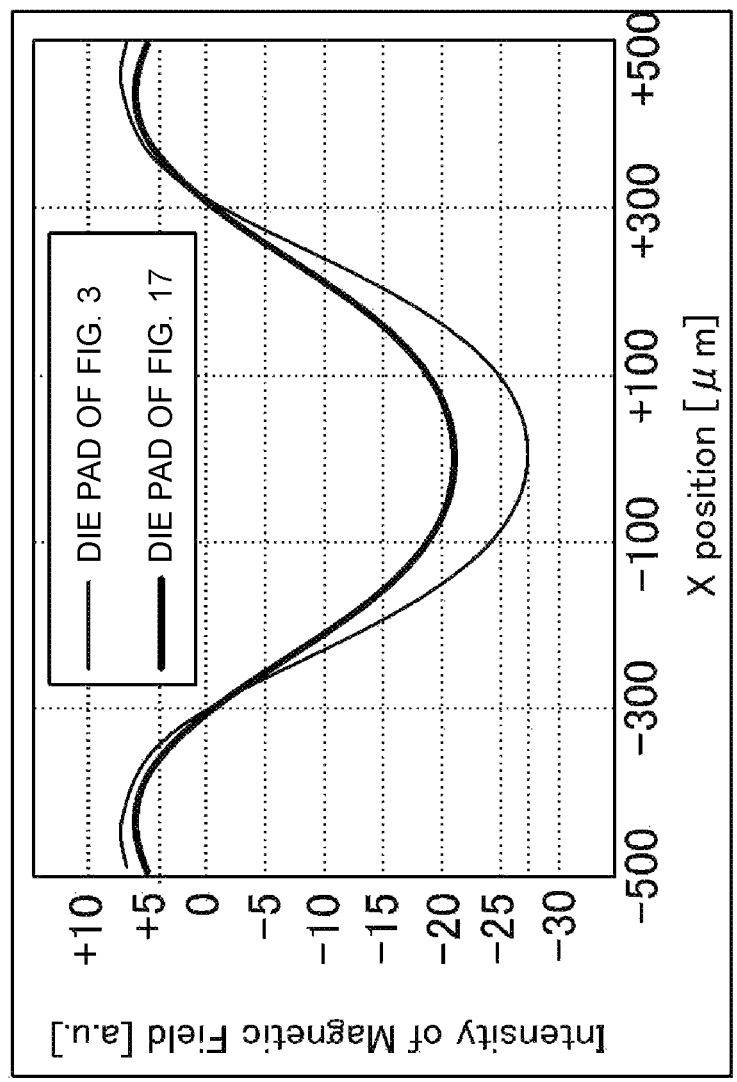
FIG. 19 is a graph illustrating calculation results of a magnetic field due to an eddy current generated in the A-A cross section in FIG. 17.

FIG. 19 is a graph illustrating calculation results of a magnetic field due to an eddy current generated along line A-A in FIG. 17 and illustrates results calculated by changing "density of eddy current" of the vertical axis in FIG. 18 to "intensity of magnetic field due to eddy current". In FIG. 19, similar to FIG. 18, the calculation result of the analytical model using the die pad of FIG. 17 according to the second embodiment is indicated by the bold line, and the calculation result of the analytical model using the die pad of FIG. 3 according to the first embodiment for comparison is indicated by the thin line. In addition, a set value for the penetration hole provided in the die pad in the second embodiment is also set to a value similar to that in FIG. 18.

As illustrated in FIG. 19, it can be seen that the die pad of FIG. 17 in which a penetration hole is provided has a weaker magnetic field due to an eddy current than the die pad of FIG. 3 in which no penetration hole is provided at a position where the X axis is in the vicinity of 0 μm. It is assumed that this is because, as illustrated in FIG. 18, the density of an eddy current has become zero at a place where a penetration hole is provided from a position of −200 μm to a position of +200 μm in the die pad of FIG. 17. For this reason, it can be seen that variation in magnetic field is further restrained and characteristics become flatter in the die pad of FIG. 17 in which a penetration hole is provided than in the die pad of FIG. 3 in which no penetration hole is provided at a position in the vicinity of 0 μm.

Therefore, as illustrated in FIGS. 18 and 19, since the density of an eddy current can be made zero at the place where a penetration hole is provided in the die pad, the peak intensity of a magnetic field generated due to an eddy current can be restrained and made flat. Accordingly, in the magnetic sensor of the second embodiment, even if the position where the Hall IC is mounted in the die pad deviates, variation in a magnetic field due to an eddy current can be restrained, and thus transient response characteristics is less likely to deviate.

Modification Example 1 of Second Embodiment

Figure 20:
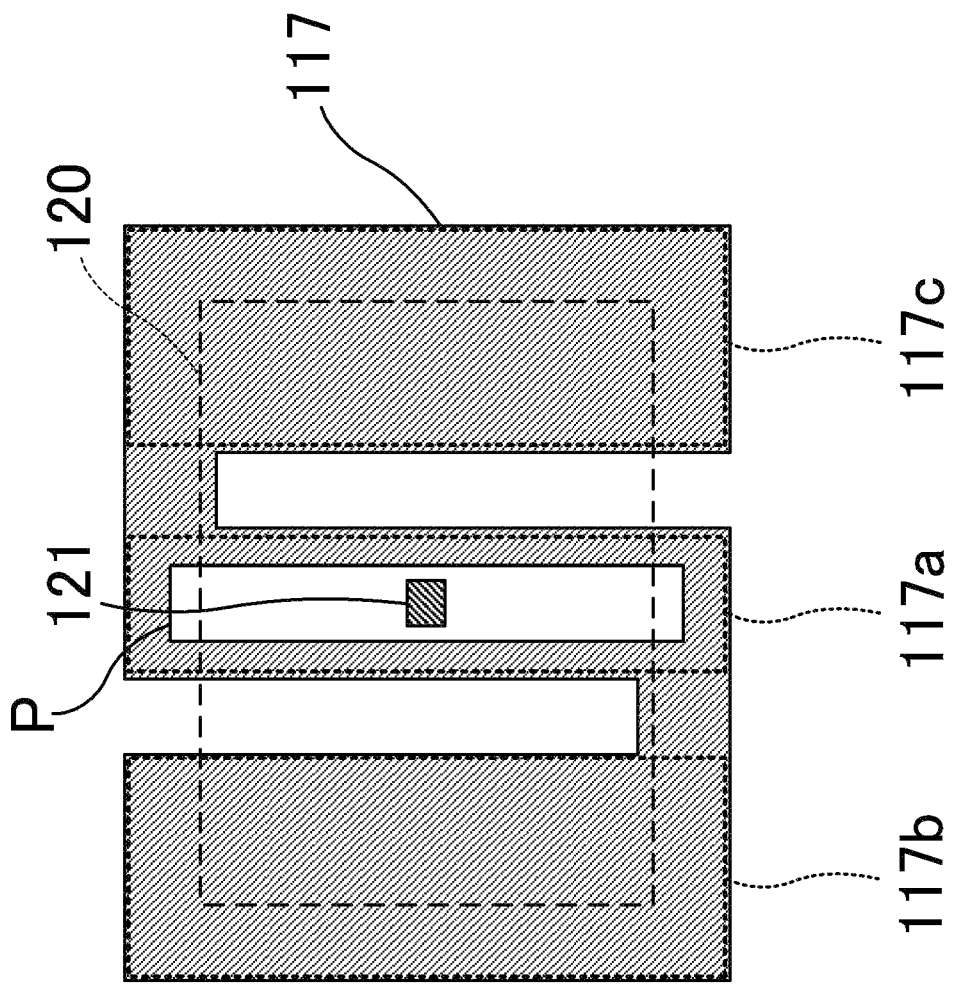
FIG. 20 is a transparent top view illustrating Modification example 1 of the magnetic sensor according to the second embodiment.

FIG. 20 is a transparent top view illustrating Modification example 1 of the magnetic sensor according to the second embodiment.

A die pad 117 illustrated in FIG. 20 is realized by providing the penetration hole P in the die pad 113 of Modification example 1 of the magnetic sensor according to the first embodiment illustrated in FIG. 14. The die pad 117 is divided into a first region 117a and second regions 117b, 117c.

In each example of the second embodiment, the penetration hole provided in the first region has a rectangular shape, but the shape is not limited thereto. In addition, the structure and the size of the penetration hole can also be suitably selected in accordance with the purpose.

As described above, the magnetic sensor according to the embodiment of the invention has a semiconductor device that has a magnetic detection element formed on a surface thereof, and a conductive substrate that supports the semiconductor device. The conductive substrate includes a first region that is disposed in the vicinity of the magnetic detection element and generates a first magnetic field due to a first eddy current generated when a measurement target magnetic field is applied, and second regions that are disposed away from the first region and generate a second magnetic field having an intensity that cancels the first magnetic field by means of second eddy currents generated when the measurement target magnetic field is applied.

Accordingly, in the magnetic sensor according to the embodiment of the invention, it is possible to improve transient response characteristics with respect to a measurement target magnetic field.

In each of the foregoing embodiments, a Hall element is used as a magnetic detection element, but the embodiments are not limited thereto. For example, a magneto-resistive element, a magneto-impedance element, or the like may be adopted, or an element or the like capable of detecting magnetism in all azimuths may be adopted. The thickness of the Hall IC and the thickness of the die pad are not limited to those in each of the foregoing embodiments and can be suitably selected.

In addition, in each of the foregoing embodiments, a notch is provided from one end side in the die pad (conductive substrate) in order to separate the first region and the second regions from each other, but the constitution is not limited thereto. For example, notches from both end sides; one, two, or more slits (penetration holes that seem to be slender in a plan view); a groove; a hole that is not penetrated; or the like may be provided such that a flow of an eddy current between the regions can be controlled. Alternatively, they may be completely separated from each other.

Moreover, each of the foregoing embodiments is described while the material of the die pad is a Cu alloy, but the material thereof is not limited thereto as long as it is a material generating an eddy current when a magnetic field is applied.

Furthermore, in each of the foregoing embodiments, the Hall IC is mounted on the die pad such that the Hall IC is positioned at the center of the first region in a plan view, but the constitution is not limited thereto as long as a magnetic field due to an eddy current can be canceled at the position of the Hall IC. That is, without being limited to each of the foregoing embodiments, the shapes, the structures, the sizes, and the materials of the first region and the second regions in the conductive substrate need only be able to be suitably selected, and a magnetic field due to an eddy current at the position of the magnetic detection element need only be able to be canceled.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A magnetic sensor, comprising:
   a semiconductor device;
   a magnetic detection element disposed on a surface of the semiconductor device; and
   a conductive substrate supporting the semiconductor device,
   the conductive substrate comprising,
      a first region disposed in a vicinity of the magnetic detection element and configured to generate a first magnetic field from a first eddy current generated by an application of a measurement target magnetic field, and
      a second region disposed away from the first region and configured to generate a second magnetic field having an intensity that cancels the first magnetic field from a second eddy current generated by an application of the measurement target magnetic field.

2. The magnetic sensor according to claim 1,
wherein the conductive substrate has a flat plate shape.

3. The magnetic sensor according to claim 1,
wherein at least one of a notch and a slit is provided between the first region and the second region.

4. The magnetic sensor according to claim 2,
wherein at least one of a notch and a slit is provided between the first region and the second region.

5. The magnetic sensor according to claim 1,
wherein an area of the first region is narrower than an area of the second region.

6. The magnetic sensor according to claim 2,
wherein an area of the first region is narrower than an area of the second region.

7. The magnetic sensor according to claim 3,
wherein an area of the first region is narrower than an area of the second region.

8. The magnetic sensor according to claim 4,
wherein an area of the first region is narrower than an area of the second region.

9. The magnetic sensor according to claim 1,
wherein the magnetic detection element has directivity, the first region is disposed in a magnetism sensing direction in which the magnetic detection element has the greatest sensitivity from a position of the magnetic detection element, and the second region is not disposed in the magnetism sensing direction from the position of the magnetic detection element.

10. The magnetic sensor according to claim 2, wherein the magnetic detection element has directivity, the first region is disposed in a magnetism sensing direction in which the magnetic detection element has the greatest sensitivity from a position of the magnetic detection element, and the second region is not disposed in the magnetism sensing direction from the position of the magnetic detection element.

11. The magnetic sensor according to claim 3, wherein the magnetic detection element has directivity, the first region is disposed in a magnetism sensing direction in which the magnetic detection element has the greatest sensitivity from a position of the magnetic detection element, and the second region is not disposed in the magnetism sensing direction from the position of the magnetic detection element.

12. The magnetic sensor according to claim 4, wherein the magnetic detection element has directivity, the first region is disposed in a magnetism sensing direction in which the magnetic detection element has the greatest sensitivity from a position of the magnetic detection element, and the second region is not disposed in the magnetism sensing direction from the position of the magnetic detection element.

13. The magnetic sensor according to claim 9, wherein the magnetic detection element is any one of a Hall element, a magneto-resistive element, and a magneto-impedance element.

14. The magnetic sensor according to claim 10, wherein the magnetic detection element is any one of a Hall element, a magneto-resistive element, and a magneto-impedance element.

15. The magnetic sensor according to claim 11, wherein the magnetic detection element is any one of a Hall element, a magneto-resistive element, and a magneto-impedance element.

16. The magnetic sensor according to claim 12, wherein the magnetic detection element is any one of a Hall element, a magneto-resistive element, and a magneto-impedance element.

17. The magnetic sensor according to claim 1, wherein a penetration hole is provided so as to contain a closest place from the magnetic detection element in the first region.

18. The magnetic sensor according to claim 1, wherein the conductive substrate has a shape with line symmetry when the conductive substrate is viewed in a plan view, and the magnetic detection element is disposed on a symmetric axis of the line symmetry.

19. The magnetic sensor according to claim 1, wherein the conductive substrate has a shape with point symmetry when the conductive substrate is viewed in a plan view, and the magnetic detection element is disposed on a center point of the point symmetry.

20. A magnetic detection method using a magnetic sensor which includes a semiconductor device, a magnetic detection element formed on a surface of the semiconductor device, and a conductive substrate that supports the semiconductor device, the conductive substrate comprising, a first region that is disposed in a vicinity of the magnetic detection element, and a second region that is disposed away from the first region, the magnetic detection method comprising:

generating a first magnetic field by a first eddy current generated when a measurement target magnetic field is applied in the first region; and generating a second magnetic field having an intensity that cancels the first magnetic field by a second eddy current generated in an application of the measurement target magnetic field in the second region.

* * * * *